(12) United States Patent
Magana et al.

(10) Patent No.: US 11,561,466 B2
(45) Date of Patent: *Jan. 24, 2023

(54) MONOLITHICALLY FRAMED PELLICLE MEMBRANE SUITABLE FOR LITHOGRAPHY IN THE FABRICATION OF INTEGRATED CIRCUITS

(71) Applicant: Intel Corporation, Santa Clara, CA (US)

(72) Inventors: John Magana, San Jose, CA (US); Guojing Zhang, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/530,755

(22) Filed: Nov. 19, 2021

(65) Prior Publication Data

US 2022/0075259 A1    Mar. 10, 2022

Related U.S. Application Data

(63) Continuation of application No. 16/832,456, filed on Mar. 27, 2020, now Pat. No. 11,194,246.

(51) Int. Cl.
   *G03F 1/64*    (2012.01)
(52) U.S. Cl.
   CPC .................................... *G03F 1/64* (2013.01)
(58) Field of Classification Search
   CPC .................................... G03F 1/62; G03F 1/64

USPC ............................................................ 430/5
See application file for complete search history.

(56) References Cited

U.S. PATENT DOCUMENTS

| | | | |
|---|---|---|---|
| 10,216,081 B2 | 2/2019 | Kohmura et al. | |
| 10,649,326 B2 | 5/2020 | Nishimura | |
| 10,768,523 B2 | 9/2020 | Nam et al. | |
| 10,859,901 B2 | 12/2020 | Nam et al. | |
| 11,194,246 B1 * | 12/2021 | Magana | G03F 1/64 |

OTHER PUBLICATIONS

Notice of Allowance from U.S. Appl. No. 16/832,456 dated Aug. 16, 2021, 8 pgs.

* cited by examiner

*Primary Examiner* — Christopher G Young
(74) *Attorney, Agent, or Firm* — Essential Patents Group, LLP

(57) ABSTRACT

Monolithic framed pellicle membrane integrating a structural framing member with a membrane spanning the framing member. The monolithic frame pellicle membrane is suitable as an overlay of a reticle employed in lithography operations of integrated circuit manufacture. A semiconductor-on-insulator (SOI) wafer may be machined from the backside, for example with a bonnet polisher, to form a pellicle framing member by removing a portion of a base semiconductor substrate of the SOI wafer selectively to top semiconductor layer of the SOI wafer, which is retained as a pellicle membrane. In some exemplary embodiments suitable for extreme ultraviolet (EUV) lithography applications, at least the top semiconductor layer of the SOI wafer is a substantially monocrystalline silicon layer.

20 Claims, 8 Drawing Sheets

MONOLITHICALLY FRAMED PELLICLE MEMBRANE SUITABLE FOR LITHOGRAPHY IN THE FABRICATION OF INTEGRATED CIRCUITS

CLAIM OF PRIORITY

This application is a continuation of, and claims the benefit of priority to, U.S. patent application Ser. No. 16/832,456, filed on Mar. 27, 2020 and titled "MONOLITHICALLY FRAMED PELLICLE MEMBRANE SUITABLE FOR LITHOGRAPHY IN THE FABRICATION OF INTEGRATED CIRCUITS," which is incorporated by reference in entirety.

BACKGROUND

Demand for higher performance integrated circuits (ICs) in electronic device applications has motivated increasingly dense transistor architectures. With the continued scaling of the physical dimensions of device features, such as transistor gates, gate contacts, and metal interconnects, nanolithography is a key enabling technology. Achieving feature dimensions in the 20-30 nm range may require extreme ultraviolet lithography (EUV or EUVL) technology using the 13.5 nm EUV center wavelength (13.3-13.7 nm band).

In the manufacture of ICs, substrate patterning employs lithographic masks, referred to as reticles. Reticle patterns should have minimal defects for highest device yields. Even in state-of-the-art cleanrooms, it is challenging to prevent minute particles present in the environment from depositing on masks during storage and usage in lithography equipment. Pellicles are typically attached to a reticle to avoid particles from becoming a printable adder to the reticle pattern. FIG. 1 depicts exploded and collapsed isometric views of a pellicle and frame assembly 100 further assembled with a reticle 115, in accordance with convention. Assembly 100 includes a pellicle membrane preform 105 attached to a pellicle frame preform 110. Assembly 100 is further attached to reticle 115 in a belliclized reticle assembly 101, which is suitable for use in lithography operations of high volume IC manufacture. Reticle 115 includes a printable pattern 130. In this example printable pattern 130 is a reversed image of what is to be printed, which is typical of an EUV reticle that relies on reflective, rather than transmissive, optics.

Pellicle frame preform 110 is often made of a rigid bulk material such as anodized aluminum or ceramic, and has a z-thickness T1 of 2-6 mm, typically set to be the same thickness as a reticle blank. During use, particles that happen to deposit on the pelliclized reticle assembly 101 fall onto pellicle 105 (or the back side of the reticle), and are therefore several millimeters away from the plane of printable pattern 130 that is imaged. With the small depth-of-field of the optical system, such particles are out of the focal plane and do not alter a pattern imaged upon an IC workpiece.

Pellicle membrane preform 105 has evolved with successive lithography generations as the emission wavelengths employed in the imaging process have become shorter. Whereas generations ago, pellicle membrane preform 105 was around 1 µm in thickness, thicknesses of 20-50 nanometer (nm) are typical for EUV systems. Such thicknesses pose an even greater challenge in view of the large area pellicle membrane preform 105 is to span, which may be 100-150 mm×100-150 mm. For EUV systems, pellicle membrane preform 105 typically has a polysilicon core or a carbon core. Polysilicon-core examples may have a variety of capping layer combinations. Carbon-core examples include graphene membranes or graphite sheets, which may also be capped with a variety of materials.

To form assembly 100, pellicle membrane preform 105 is first fabricated and then transferred to pellicle frame preform 110. Yield losses associated with fabrication steps such as separating and transferring the thin, large area membrane are significant and thus currently result in high unit cost per piece part, and low availability/supply. Additionally, as illustrated in FIG. 1, pellicle frame preform 110 is typically itself an assembly of multiple individual parts (e.g., flexures 120, which couple to reticle studs 125). Each of these parts present fabrication challenges, and all have yield losses associated with both their discrete manufacture and their integration into assembly 100. In aggregate, these issues translate into the cost of a single pellicle assembly 101 being in the tens of thousands of dollars. Considering the number of assemblies needed for each IC device product, and their finite lifetimes owing to the inherent fragility of each assembly, pellicle assembly costs can be a significant factor in the unit cost of a IC device.

Pellicles and pelliclized reticle assemblies and their methods of fabrication that can address one or more of the above issues would therefore be commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
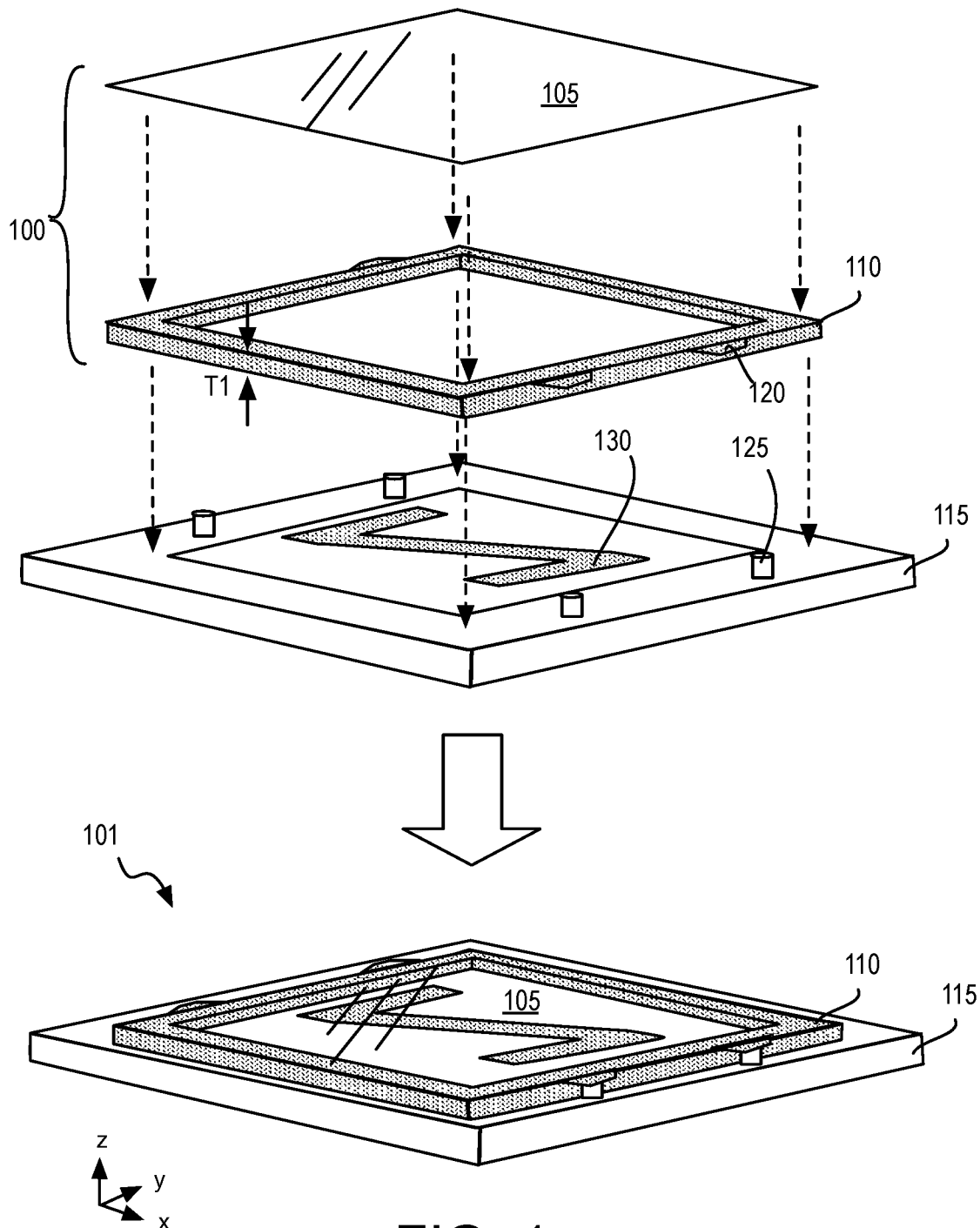
FIG. 1 depicts exploded and collapsed isometric views of a reticle with a pellicle and frame assembly, in accordance with convention.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material disposed over or under another may be directly in contact or may have one or more intervening materials. Moreover, one material disposed between two materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In accordance with some embodiments herein, a monolithic framed pellicle membrane integrates a structural framing member with a membrane spanning the framing member. The monolithic frame pellicle membrane is suitable as an overlay of a reticle employed in lithography operations of integrated circuit manufacture. The term "monolithic" is used herein in the context of the a framed pellicle membrane to mean both the membrane and the structural frame are of a single, contiguous starting substrate comprising at least a first material layer, that is to become the membrane, and a second material layer that is to become the frame. As described further below machining from a contiguous starting material offers significant advantages over separately preforming a discrete membrane material and a discrete frame material and then assembling the discrete components together.

As described below, both material layers of the monolithic framed pellicle may have substantially the same chemical composition, with perhaps only a minority impurity dopant concentration differing between the material layers. In some embodiments, both the frame material and the membrane material are single crystalline. In some such embodiments, both the frame material and the membrane material have the same crystallinity, are of the same crystal orientation, and of substantially the same composition, such that the both the membrane and frame are of a single piece, or monolith, of crystal.

As further described below, a monolithic starting workpiece may be a semiconductor-on-insulator (SOI) substrate, which is subtractively machined, for example from the back side, to define a structural frame that is dimensioned to attach to a perimeter of a reticle, and to stand off a front side of the SOI workpiece by at least a few millimeters. In some exemplary embodiments suitable for extreme ultraviolet (EUV) lithography applications, at least the top crystalline material layer of the SOI wafer is silicon. Although all embodiments leverage the crystallinity and the monolithic nature of an SOI material, some embodiments may further leverage semiconducting properties of an SOI substrate, for example as a means of controlling electrostatic charge and/or as a means of integrating sensory devices into the monolithic framed pellicle.

As further described below, a CNC bonnet polisher may be employed to machine the SOI workpiece into a pellicle framing member by removing a portion of a base crystalline substrate material layer of the SOI wafer. Such back side processing may further comprise removing one or more material layers from the SOI wafer selectively to an insulator layer of the SOI wafer to ensure the precise thickness of the top crystalline layer of the SOI wafer is fully retained as a pellicle membrane. One or more thin films may be deposited over a front side of the SOI wafer to prepare the monolithic structure for use as a pellicle in an EUV environment.

Methods described herein generally entail processing a monolithic workpiece comprising a substantially monocrystalline membrane material layer over a substantially monocrystalline frame material layer with an intervening material layer therebetween. When practicing the methods described herein, the monolithic workpiece may be mounted to a carrier with a front side of the first material layer facing the carrier. While mounted, a recess may be subtractively machined into the second material layer with a remainder of the second material layer framing a perimeter of the recess. A membrane spanning the recess may be formed from the first material layer by the exposing a back side of the intervening material layer with an etchant that removes the second material selectively from the intervening material. The intervening material layer may therefore have any composition suitable for serving as a etch stop ensuring the uniform thickness of the first material layer is retained as an optimal membrane thickness of high strength and low absorbance.

Figure 2A:
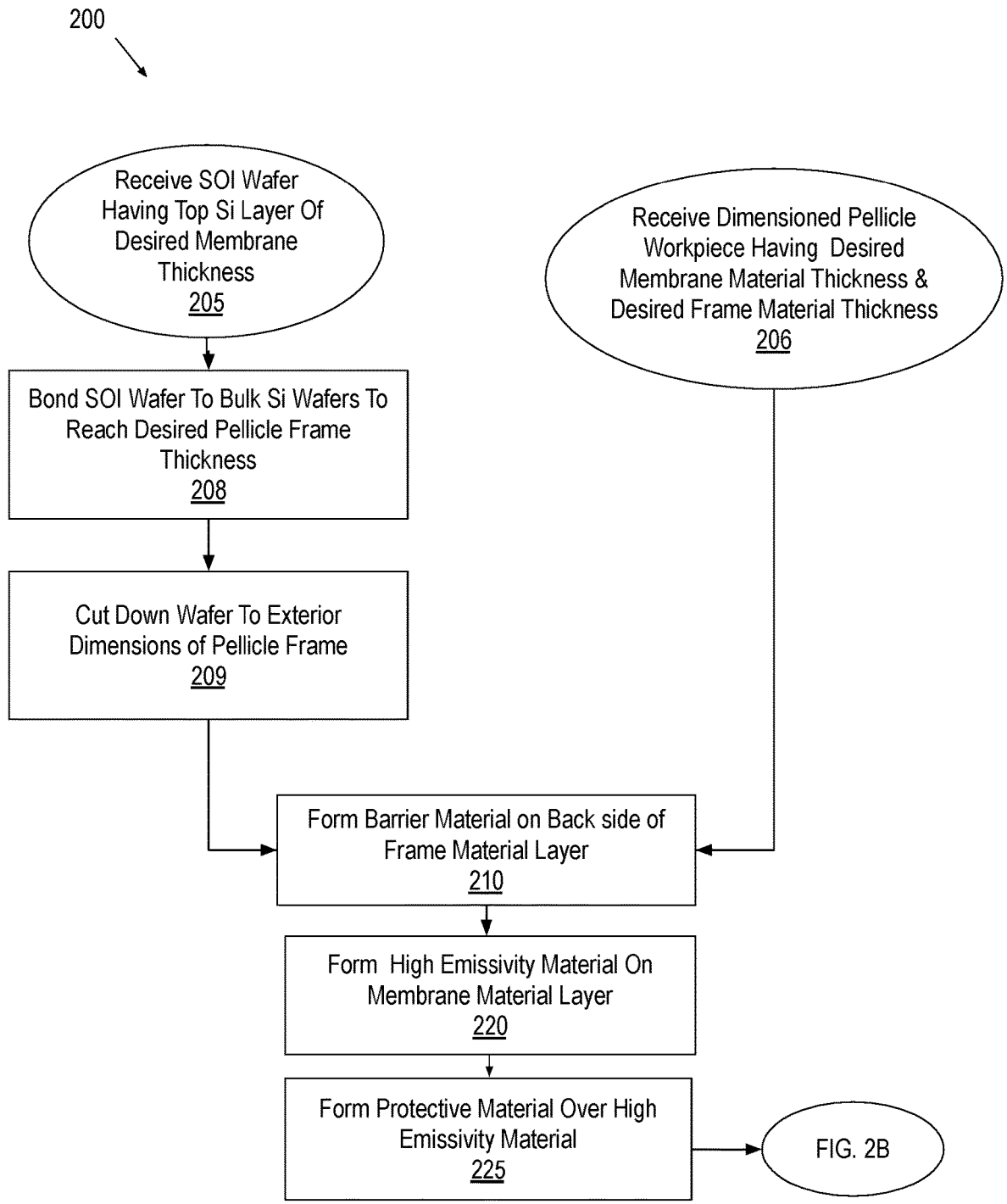
FIG. 2A-2B are flow diagrams illustrating methods of fabricating a monolithic framed pellicle, in accordance with some embodiments.
Figure 2B:
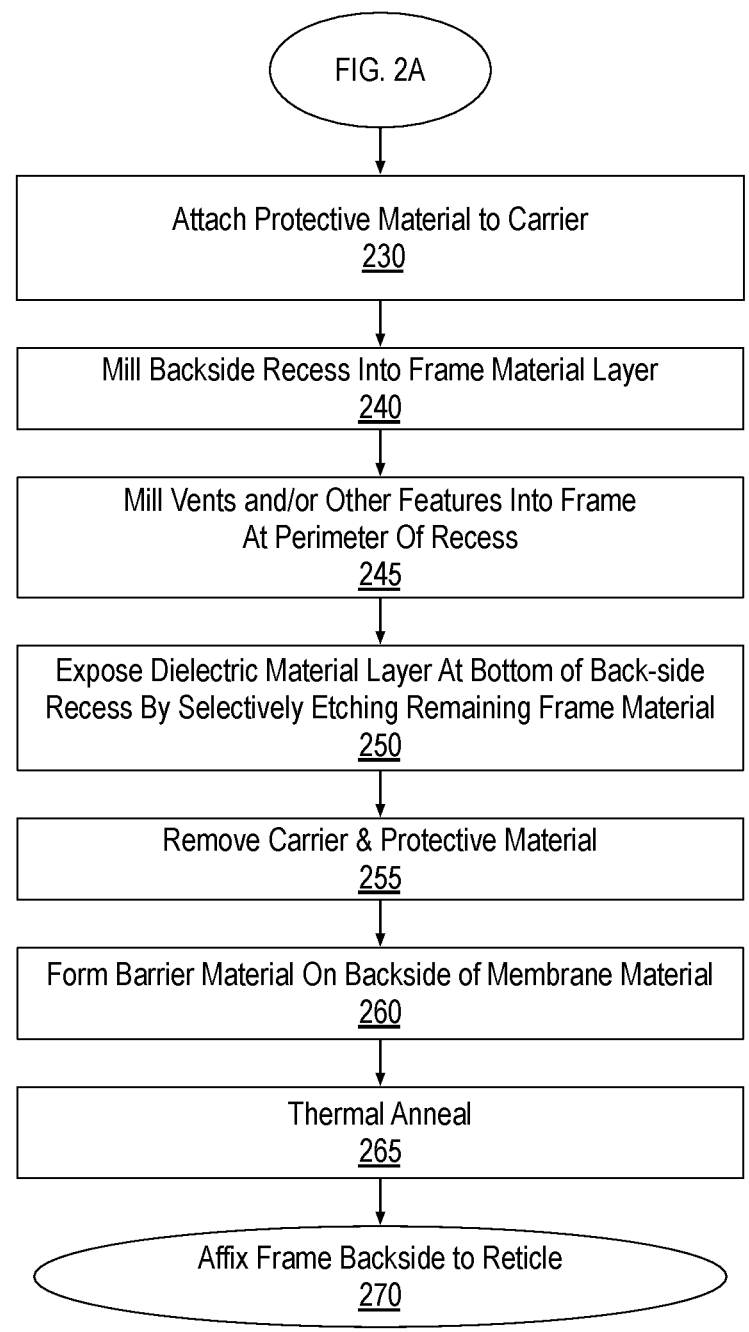

FIG. 2A-2B are flow diagrams illustrating methods 200 for fabricating a monolithic framed pellicle, in accordance with some embodiments. Methods 200 provide illustrative examples that may be readily modified within the scope of the broader techniques specifically demonstrated. In some embodiments, methods 200 begin with an input 205 where a commercially available SOI wafer is received. The SOI wafer may have any diameter sufficient for the pellicle frame dimensions with some examples being 200 mm, 300 mm, or even 450 mm. In some embodiments, the wafer received is a semiconductor-on-insulator (SOI) wafer having a top material layer that is referred to herein as the "membrane" material layer as it is to become the pellicle membrane.

In exemplary embodiments, the membrane material layer is predominantly silicon that is of a predetermined thickness suitable for a pellicle membrane. In some advantageous embodiments, at least the membrane material layer is a substantially monocrystalline (CZ) silicon (i.e., substantially pure silicon) with only a minority concentration of one or more impurities. Single crystal silicon membrane material is particularly advantageous for EUV embodiments because monocrystalline silicon has a favorably low absorption coefficient within the EUV emission band (e.g., <0.0015 at 13.5 nm). With the low absorption coefficient, a silicon single crystal pellicle membrane can have transmission of 95%, or more, as a function of thickness. In comparison, polycrystalline silicon has a higher absorption coefficient such that polycrystalline silicon membranes may achieve only ~82% transmission value even at thicknesses of only 20 nm. Noting that EUV systems are entirely reflective such that imaging radiation must pass through a pellicle membrane twice, transmission rates are compounded (e.g., with 82% transmission then translating to a loss of ~43% of incident EUV imaging radiation). Hence, the level of membrane transmission is important as a loss of transmission can significantly reduce throughput of a EUV imaging system.

Relative to polysilicon, single crystal silicon also has lower defectivity, significantly lower surface roughness, and intrinsically higher mechanical strength than polycrystalline silicon (as shown in Table 1.)

TABLE 1

|  | Single crystal Silicon | Polysilicon |
| --- | --- | --- |
| Yield strength (GPa) | 2.8-7 | 1.21 |
| Density (kg/m3) | 2330 | 2320 |
| Young's Modulus (GPa) | 62-202 | 120-203 |

A single crystal silicon membrane should therefore be less subject to failure mechanisms associated with EUV scanner exposure. In some exemplary embodiments, a single crystal silicon membrane layer has a thickness less than 200 nm, and more particularly in the range of 15-150 nm. Thinner membranes offer the advantage of higher transmission. The lower thickness threshold of single crystalline silicon is below that of polycrystalline and amorphous films, which more readily suffer the formation of pinholes as thicknesses are reduced. However, due to its high EUV band transmission, a single crystal silicon membrane can be significantly thicker (e.g., up to 10× thicker than other materials) and still yield acceptable optical properties. Greater membrane thickness is advantageous from a structural and mechanical standpoint. Thicker membranes are less prone to form local wrinkle defects (i.e., local slope variations). Therefore, in some mechanically advantageous embodiments, the membrane thickness is at least 50 nm.

Figure 3A:
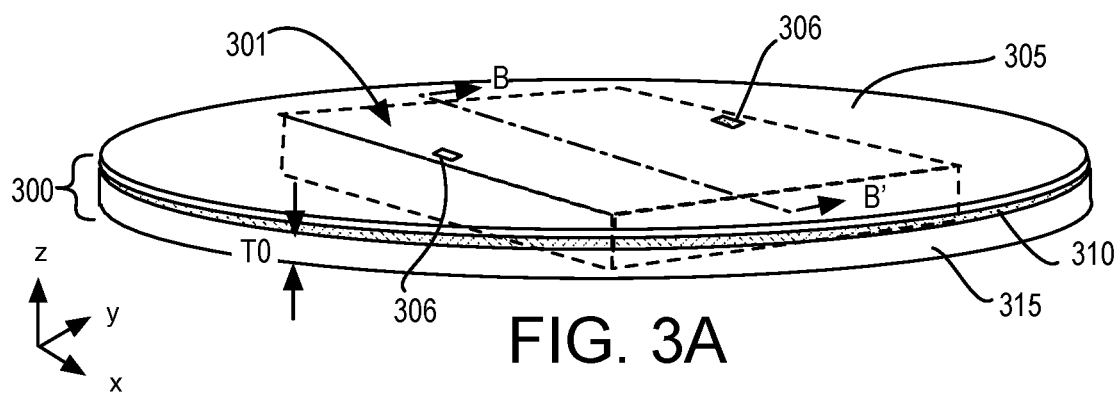
FIG. 3A illustrates an isometric view of a monolithic framed pellicle delineated within a semiconductor on insulator (SOI) wafer from which it is machined, in accordance with some embodiments.

FIG. 3A illustrates an isometric view of an exterior perimeter edge of a monolithic framed pellicle workpiece 301 delineated by dashed line within a SOI wafer 300 from which framed pellicle workpiece 301 is to be machined, in accordance with some embodiments. As shown in FIG. 3, SOI wafer 300 includes a thin monocrystalline membrane material layer 305 over a thick base, or "frame," material layer 315, and an intervening (insulator) material layer 310 buried between material layers 305 and 315. Frame material layer 315 may also be predominantly silicon, and in some advantageous embodiments, both frame material layer 315 and membrane material layer 315 are substantially monocrystalline silicon (i.e., substantially pure silicon). Both base material layer 315 and thin material layer 305 may have substantially the same crystal orientation such that the two material layers are top and base layers of one crystal. Although the crystal orientation may vary, in some advantageous embodiments the crystal orientation is such that a front, or top, side surface of membrane material layer 305 is a {111} crystal facet. As noted further below, such an orientation may facilitate an anisotropic etch of base material layer 315. A {100} crystal facet may also be suitable as the front side surface of membrane material layer 305 (opposite frame material layer 315).

Either, or both of membrane material layer 305 and frame material layer 315 may include specific impurity dopant species. Membrane material layer 305 may be doped with electrically active impurities for lower electrical resistivity or may only have intrinsic (unintentional) impurities for a high resistivity. Doping species and/or concentration may also be adjusted to optimize the optical properties, mechanical properties and/or chemical resistance of membrane material layer 305. Noting that single crystalline silicon becomes less susceptible to hydrogen etching with higher Boron concentrations, in some embodiments, membrane material layer 305 is doped with at least boron to improve the membrane's resistance to energetic hydrogen radicals than can be generated on the reticle plan during EUV exposure in a lithography system.

In some embodiments, SOI wafer 300 may be received with one or more sensors 306 integrated into top material layer 305. As SOI wafer 300 may be readily processed through nearly any IC fabrication flow, sensors 306 may include one or more integrated circuit or microelectromechanical systems (MEMS) that has been fabricated directly on top material layer 305 upstream of methods 200. Such integrated circuitry and/or MEMS may be integrated into monolithic framed pellicle workpiece 301 as sensors 306. Sensors 306, may, for example, sense pellicle membrane thermomechanical or electrical properties, and/or sense environmental conditions. In some embodiments, sensors 306 may sample over time one or more properties such as, but not limited to, a pellicle membrane temperature, pellicle membrane acceleration, or pellicle membrane strain. In one specific example, sensors 306 include a piezoelectric effect device that senses a change in electrical resistivity of the single crystal silicon membrane material as a function mechanical strain. Such a sensor may be incorporated on the membrane material 305, and associated circuitry (e.g., a wheatstone bridge, signal amplifier, etc.) could be also integrated onto the membrane material 305 (e.g., within a peripheral region of monolithic framed pellicle workpiece 301). Sensors 306 may further comprise memory to store sensor data, and/or RF telemetry circuitry to transmit sensor data, and/or programmable logic circuitry. Sensors 306 may be powered directly, for example with a surface mount battery attached to monolithic framed pellicle workpiece 301. Sensors 306 may also be powered by a photovoltaic fabricated on, or mounted to, monolithic framed pellicle workpiece 301 that may convert incident EUV radiation into stored charge. Alternatively, sensors 306 may be powered through remote source coupled through either a conductive route (e.g., a through silicon via) between base material layer 315 and top material layer 305, or through a near field inductive power coupler fabricated or mounted to monolithic framed pellicle workpiece 301.

As shown in FIG. 3A, frame material layer 315 has a base thickness T0. Base thickness T0 may vary and may only be 1 mm, for example, as a function of the diameter of SOI wafer 300. Hence while membrane material layer 305 may be of thickness suitable as a pellicle membrane, base material thickness T0 may need to be supplemented, for example at block 208 (FIG. 2A) where one or more bulk semiconductor wafers are bonded to a back side of an SOI wafer to reach a thickness desired for a pellicle frame. Any wafer-level thermo-compression bonding process may be practiced, for example to directly bond a monocrystalline silicon wafer to a back side of the frame material layer 315 (FIG. 3A). Such a bonding process may be repeated any number of times to reach a desired frame material layer thickness (e.g., 2-3 mm). The bonded wafer stack may be of monocrystalline material layers (e.g., 2-3 layers) which may advantageously have the same crystal orientation, for example for consistent mechanical properties that minimize warpage.

Insulator, or dielectric material, layer 310 also comprises silicon in some advantageous embodiments, but is an amorphous material layer at the interface of membrane material layer 305 and frame material layer 315. In some such embodiments, dielectric material layer 310 is predominantly silicon and oxygen (e.g., $SiO_2$). While dielectric material layer 310 may have any thickness, in some embodiments it is less than 100 nm, and may even be 10 nm, or less. In some embodiments where dielectric material layer 310 is a directly buried layer (e.g., where oxygen is implanted to a specific depth of a single silicon and annealed), both membrane material layer 305 and frame material layer 315 will have the same crystallinity (e.g., (111)) at the interfaces of dielectric material layer 310. In other embodiments where dielectric material layer 310 is indirectly buried (e.g., when an oxidized surface of a silicon wafer is bonded to another), membrane material layer 305 and frame material layer 315 may, but need not, have the same crystallinity at the interfaces of dielectric material layer 310.

Regardless of the crystal orientations of various material layers that might make up frame material layer 315, dielectric material layer 310 and membrane material layer 305, the multi-layered laminate SOI wafer is still to be considered monolithic in that the various material layer interfaces are metallurgical with diffusion and/or molecular bonding across the interfaces.

Returning to FIG. 2A, methods 200 continue at block 209 where the SOI wafer is cut down to the exterior dimensions of the pellicle frame. The processing at block 209 may be performed with any wafer scribe-and-break, laser ablation, or die saw machine, for example. For some embodiments, the SOI wafer is cut down to be rectangular with an area of at least 100 mm-150 mm by 100 mm-150 mm (e.g., following the dashed lines outlining monolithic framed pellicle workpiece 301 in FIG. 3A). Following block 209, the monolithic framed pellicle workpiece has the thickness and lateral dimensions suitable for a framed pellicle. Notably, block 209 need not be performed in the sequence illustrated in methods 200 and is merely one possibility. In other embodiments, for example, subsequent blocks of method 200 may be performed at the wafer-level, and the wafer subsequently cut down.

In alternative embodiments also illustrated in FIG. 2A, methods 200 may instead begin with receiving a dimensioned monolithic framed pellicle workpiece at input 206. The workpiece for such embodiments has been machined upstream of methods 200 to have exterior dimensions suitable for an outer perimeter edge of a monolithic framed pellicle. For example, the monolithic framed pellicle workpiece received at block 206 may be substantially the same as the monolithic framed pellicle workpiece generated by block 209 and have any of the properties described above in the context of a SOI wafer (e.g., monocrystalline silicon membrane and frame layers of desired area and thickness) received at input 205.

Figure 3B:
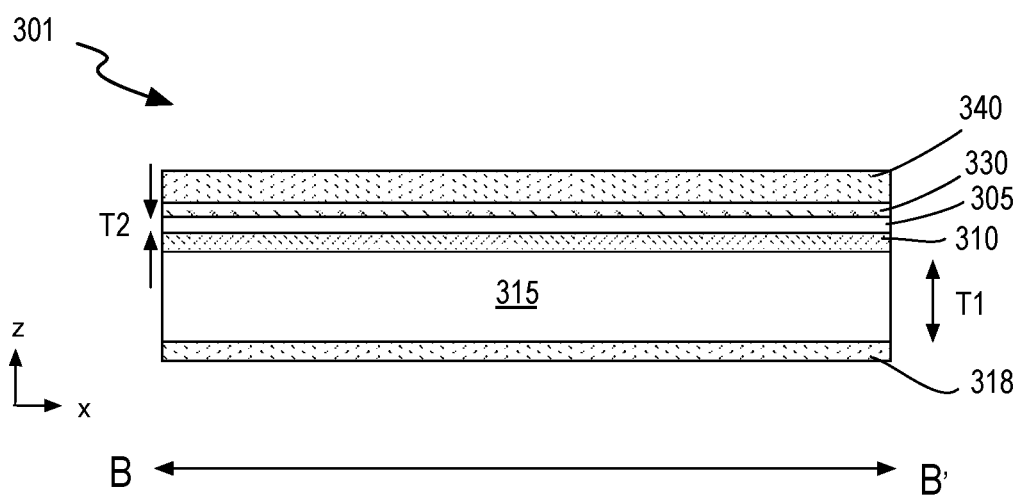
FIG. 3B is a cross-sectional view of a monolithic framed pellicle workpiece evolving to include backside and frontside material layers, in accordance with some embodiments.

Methods 200 continue with blocks 210, 200 and 225 where the monolithic frame pellicle workpiece is coated with or more backside and front side thin film capping layers, for example to arrive at the monolithic framed pellicle workpiece 301 illustrated in cross-section in FIG. 3B along the B-B' line also shown in FIG. 3A. As illustrated in FIG. 3B, a backside barrier layer 318 is over, and in contact with, a back side of frame material layer 315, which at this point has a desired frame thickness T1 (e.g., 1-3 mm). Dielectric material layer 310 is between, and in contact with, frame material layer 315 and membrane material layer 305. Membrane material layer 305 has a thickness T2 (e.g., 15-150 nm). High emissivity layer 330 is over, and in contact with, membrane material layer 220, and a protective layer 340 is over, an in contact with high emissivity layer 330. While FIG. 3B illustrates one example, any number of other membrane capping layers can be incorporated onto either the front or back side in substantially the same manner.

The various thin film layers illustrated in FIG. 3B may be formed in any order on a workpiece or at the wafer level prior to the wafer being cut down into the workpiece. In the example illustrated in FIG. 2A, methods 200 continue at block 210 where one or more thin film layers of barrier material are first formed upon the back side of the monolithic framed pellicle workpiece (opposite the membrane layer). Backside barrier material layer(s) formed at block 210 may advantageously protect the underlying frame material layer. In some embodiments, barrier material layer is a silicon nitride layer (e.g., $Si_3N_4$) thermally grown in a furnace with ammonia or other suitable feed gas(es). Such a film may have high density and serve as a good barrier against reactions between a silicon frame material and hydrogen radicals generated in the scanner environment.

Alternatively, a silicon nitride (again comprising silicon and nitrogen but not necessarily in stoichiometric amounts) barrier material may be deposited using any suitable technique, such as, but not limited to, low pressure chemical vapor deposition (LPCVD) or plasma enhanced CVD (PECVD).

Methods 200 continue at block 220 where the high emissivity material layer is formed on the front side of the membrane material layer to improve membrane heat dissipation during exposure to imaging radiation (e.g., EUV). The high emissivity material may be any material having a higher emissivity than the membrane material, but in some exemplary embodiments where the membrane material is silicon, the high emissivity material is Ru. A Ru emissivity layer may have a thickness in the range of 2-5 nm, for example, and may be deposited by any of physical vapor deposition (PVD), ion beam deposition (IBD), or atomic layer deposition (ALD).

Methods 200 continue at block 225 where one or more protective material layers are deposited over the high emissivity material layer. The protective material is sacrificial and is to be subsequently removed. As such, the choice of material(s) may vary with one example being a silicon-based dielectric, such as a deposited silicon oxide (e.g., low density with an RI<1.46). The protective material coating may be deposited at a low temperature with LPCVD to a thickness ranging, for example, from 0.5 µm to 1 µm.

As further illustrated in FIG. 2B, methods 200 continue at block 230 where the monolithic framed pellicle workpiece is attached to a carrier with the membrane material layer facing the carrier, and the protective layer in contact with the carrier, in preparation for backside processing. Noting the monolithic framed pellicle workpiece is ultra-flat (e.g., having been cut from a specular SOI substrate prepared under stringent CMOS fabrication requirements), the carrier is advantageously also ultra-flat. In some embodiments, the carrier is a chemical mechanical polish (CMP) carrier assembly. The carrier assembly may include, for example, an ultra-flat quartz or metal block. Bonding of the protective layer to the carrier can be accomplished through a variety of techniques, such as any commonly used in MEMS full-wafer temporary bonding processes. Examples include temporary bonding with a spin or spray adhesive or low temperature solder bonding at a plurality of sites along the periphery of the monolithic framed pellicle workpiece. Alternatively, the monolithic framed pellicle workpiece may be affixed to the carrier by mechanical means, such as, but not limited to, edge clamps, or screws.

Figure 4A:
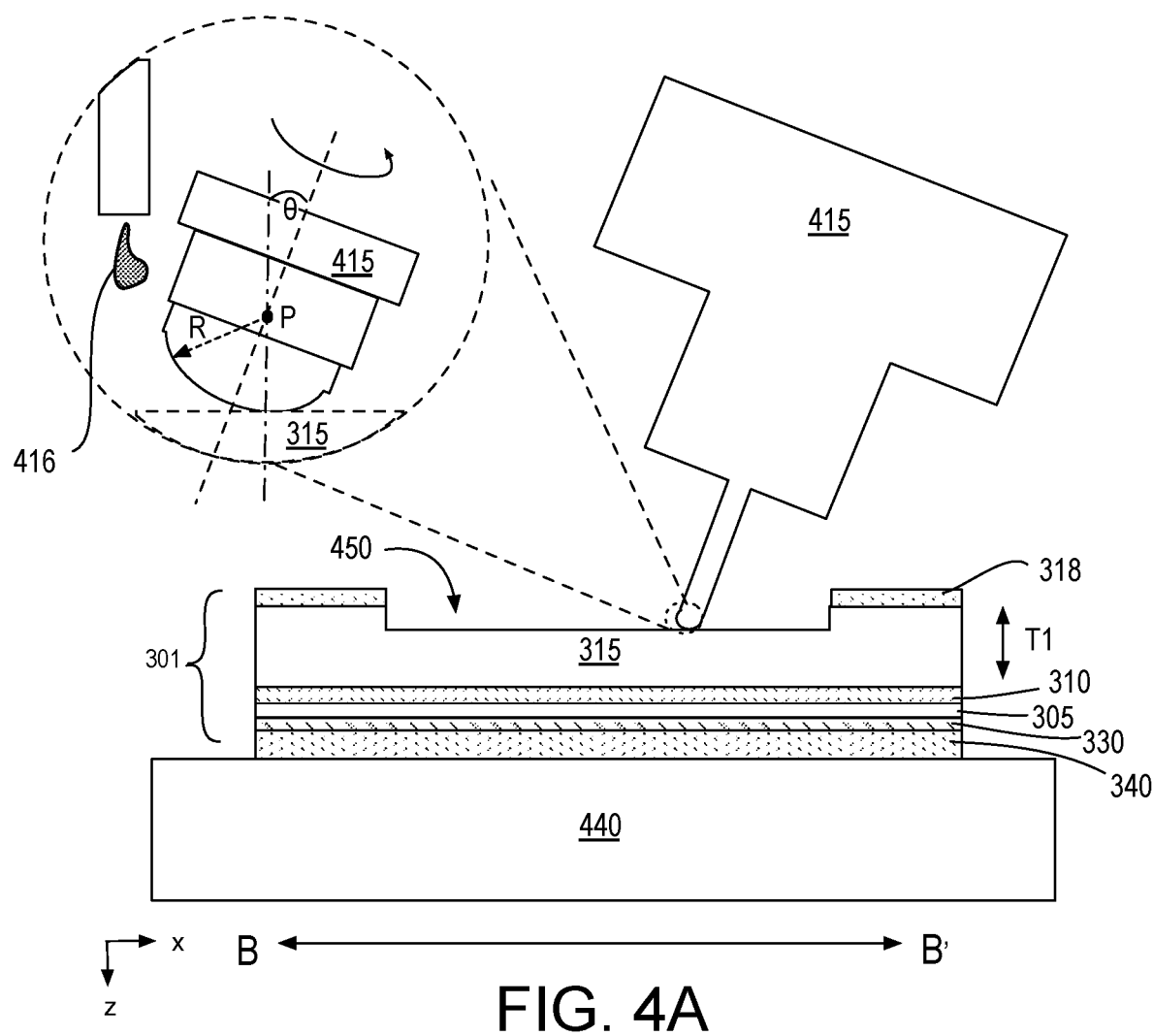
FIG. 4A is a cross-sectional view of a monolithic framed pellicle workpiece being machined from the back side with a bonnet polisher, in accordance with some embodiments.

Methods 200 continue at block 240 where a recess is milled into the frame material. In exemplary embodiments, bonnet polishing or a similar physical milling technique is employed to fabricate the recess. Bonnet polishing is often employed in ultra-high precision optical lens manufacturing, for example. FIG. 4A is a cross-sectional view of a monolithic framed pellicle workpiece being machined from the backside with a bonnet polishing tool 415, in accordance with some embodiments. As shown in FIG. 4A, monolithic framed pellicle workpiece is mounted to carrier 440. Bonnet polishing tool 415 is capable of precessed polishing and may be manipulated with a 7-axis CNC, for example. As shown in the expanded view, bonnet polishing tool 415 has a primary spindle axis, from which the bonnet may precess by angle θ about a virtual pivot point P. A membrane of radius R applies a controlled pressure at a spot on where frame material 315 (e.g., monocrystalline silicon) is polished away. The bonnet polishing tool 415 traverses the area that will retain only the pellicle membrane to advance recess 450 progressively deeper into frame material 315. Bonnet polishing tool 415 may employ any fluid slurry material 416 suitable for the frame material (e.g., silicon), such as, but not limited to, cerium oxide, ceria, or fumed silica. Bonnet polishing tool 415 is capable of milling a dimensionally precise recess through the majority of the frame material thickness T1, and yielding a smooth surface (RMS roughness <10 nm) for subsequent processing that is more selective to the intervening dielectric material layer.

Although bonnet polisher milling may be a particularly advantageous technique, other techniques of forming the recess may be employed in alternative embodiments. For example, in some embodiments an ultrasonic milling machine or a properly tooled high-precision vertical CNC milling machine (e.g., ROBODRILL α-DiB5 commercially available from FANUC America Corporation) is employed to grind a recess into the frame material (e.g., silicon crystal). Additionally, if the appropriate crystalline orientation is employed for a crystalline silicon frame material layer, then anisotropic etching of the recess can be accomplished by a chemical etchant (e.g., KOH, TMAH and other alkaline hydroxides like NaOH and LiOH).

Figure 4B:
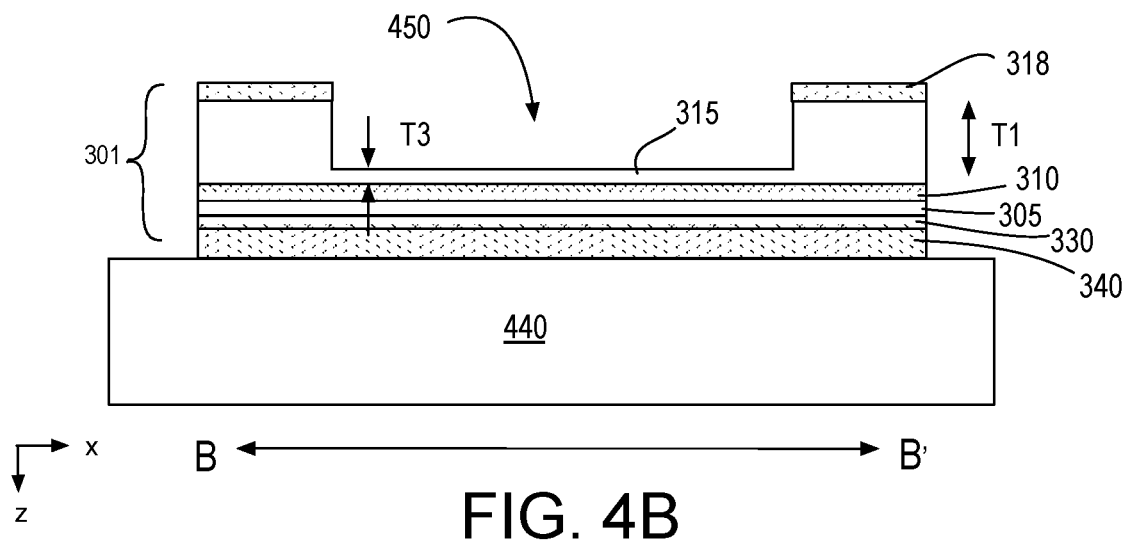
FIGS. 4B, 4C and 4D illustrate cross-sectional views of a monolithic framed pellicle workpiece evolving to include a machined pellicle structural frame, in accordance with some embodiments.

FIG. 4B illustrates cross-sectional views of a monolithic framed pellicle workpiece evolving to include a pellicle structural frame, in accordance with some embodiments. As shown, machining has stopped with a partial thickness T3 of frame material layer 315 remaining. With recess 450 having a sufficient depth at this point, methods 200 (FIG. 2B) may continue at block 245 where additional backside machining (e.g., bonnet polishing) may be conducted to mill vents and/or other features into a back side of the frame surrounding the recess.

Figure 4C:
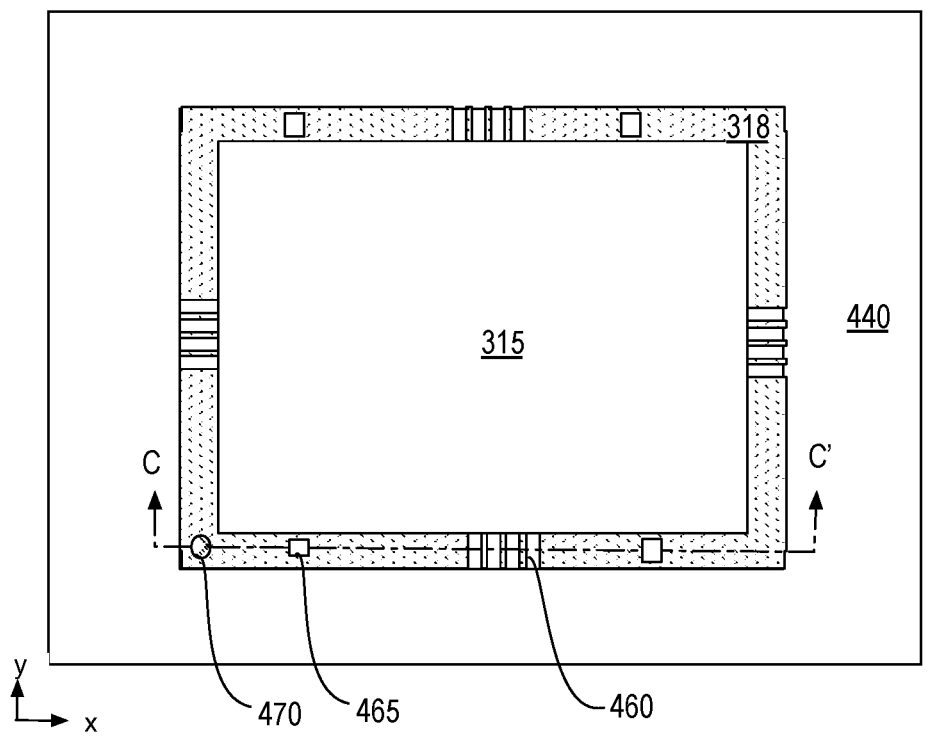
Figure 4D:
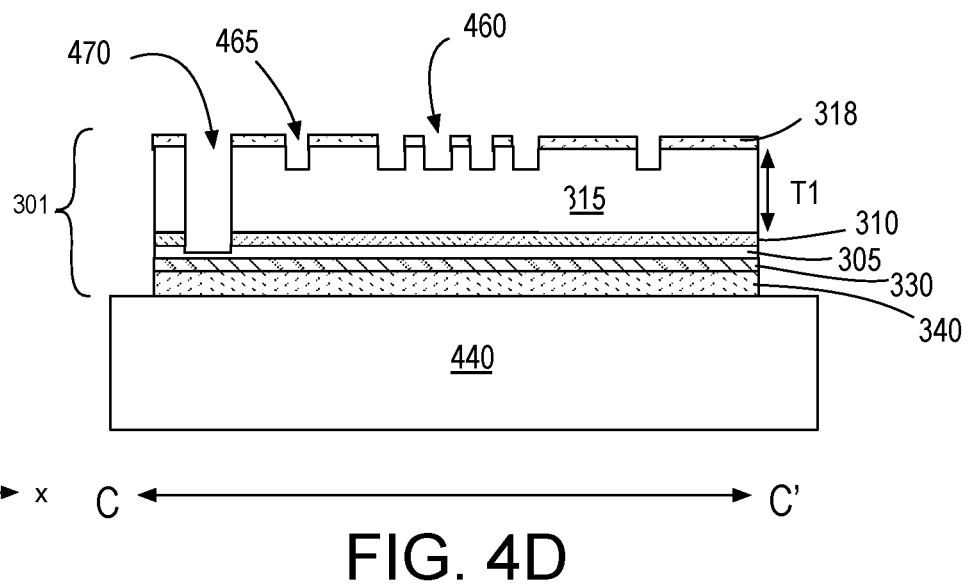

FIG. 4C illustrates a plan view of a pellicle structural frame including backside features defined in monolithic framed pellicle workpiece, in accordance with some embodiments. In this example, bonnet polishing or another suitable milling technique is utilized to cut vent grooves 460 in one or more of sides of the structural frame to allow for pressure equalization in vacuum environments (e.g., in scanner, actinic inspection metrology tooling, actinic pattern mask inspection tooling, etc.). Although vent grooves 460 are illustrated as straight through a transverse width of the peripheral frame material, a more circuitous path may be similarly milled, if desired. Bonnet polishing and/or drilling can be further employed to fabricate studs or detents 465 in the back side surface of the frame material, for example to facilitate subsequent alignment and/or mounting to mating features of a reticle surface. Bonnet polishing and/or drilling may also be employed to fabricate a through via 470 into, and substantially through, frame material 470. Through via 470 may be subsequently filled with a conductive material (e.g., solder, etc.) to serve as a conductive route between a reticle surface and an IC or MEMS device integrated into the membrane material layer, for example as described above. FIG. 4D illustrates a cross-sectional view of monolithic framed pellicle workpiece 301 along the C-C' line illustrated in FIG. 4C, in accordance with some embodiments. As shown, vent grooves 460 may have a depth less than frame thickness T1. Likewise, detents 465 may be any depth to provide sufficient clearance for a mating stud on the surface of a reticle. Through via 470 however extends completely through frame material thickness T1, and also extends completely through dielectric material layer 310. As shown, through via 470 stops within membrane material layer 305, for example to intersect an unlanded via (not depicted) that was previously fabricated in membrane material layer 305 during the fabrication of an IC or MEMS device (e.g., as part of integrated sensor 306 in FIG. 3A). Through via 470 may extend further to be landed on a device fabricated on the membrane material layer 305. Such a connection could facilitate measure of the membrane electrical properties. For example, resistance of the membrane could be measured and thus employed as a means for determining the continuity of the membrane (e.g., to detect if the membrane has ruptured). In still other embodiments, for example where membrane material resistivity is sufficiently lower through impurity doping, through via 470 may intersect/connect directly to membrane material layer 305. In some specific examples, a plurality of through vias 470 may be fabricated in order to tie membrane material layer 305 to an electrical potential of an underlying reticle to which it is attached.

Figure 4E:
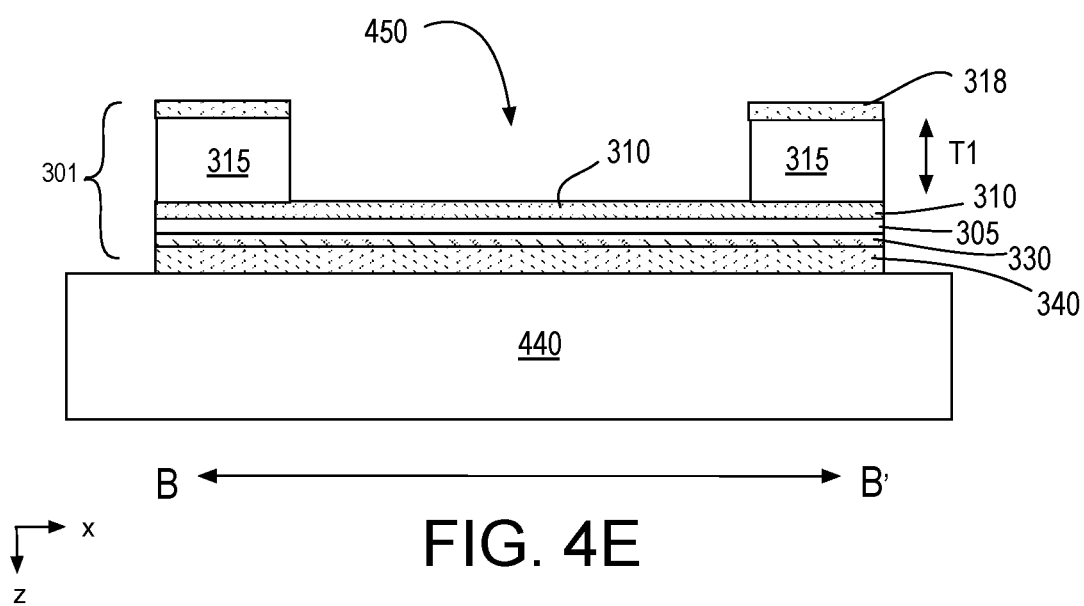
FIG. 4E illustrates a plan view of a monolithic framed pellicle workpiece, in accordance with some embodiments.
Figure 4F:
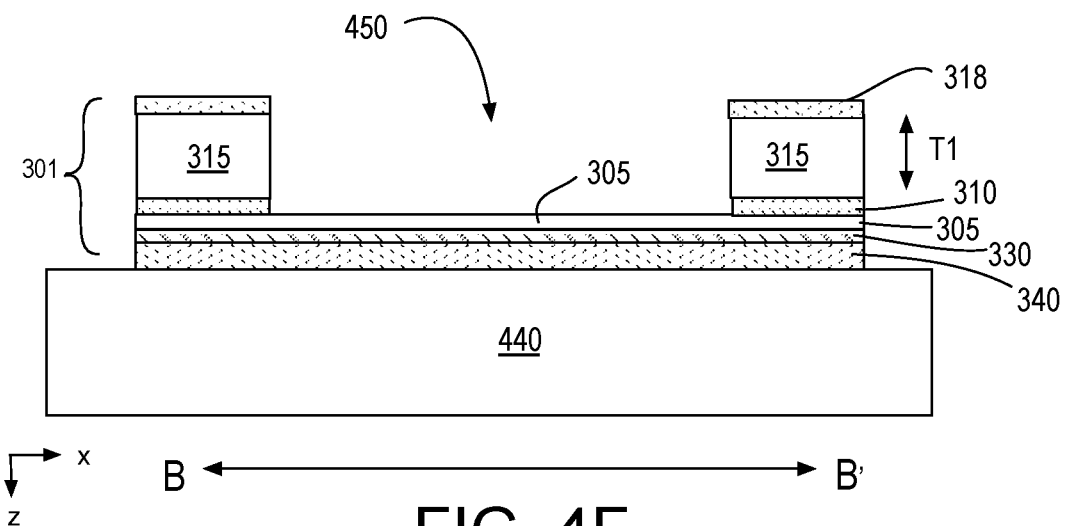
FIG. 4F illustrates a cross-sectional view of a monolithic framed pellicle workpiece including backside features, in accordance with some embodiments.

Returning to FIG. 2B, methods 200 continue at block 250 where the insulator layer of the workpiece is exposed at a bottom of the backside recess by selectively etching the remaining frame material thickness T3 with any process offering adequate selectivity to the frame material (e.g., Si) over the dielectric material (e.g., $SiO_2$). In some exemplary embodiments, reactive ion etch (RIE) is employed to remove the remaining silicon frame material layer, and stop on the buried dielectric material layer. A dep/etch/dep Bosch type etch may be employed, for example, to arrive at the structure further illustrated in FIG. 4E. In some embodiments, the dielectric material layer 310 is also selectively removed to expose a backside of membrane material layer 305, for example as further illustrated in FIG. 4F. RIE or any other etching technique (e.g., wet chemical) of sufficiently high selectivity to membrane material layer 305 may be practiced. Notably, if the starting thickness of dielectric material layer 310 is thin enough (e.g., <10 nm), reduction in membrane transmission will be minimal, and so dielectric material can be left in contact with the membrane back side (i.e., the aforementioned operation can be omitted).

Returning to FIG. 2B with the dielectric material layer 310 now exposed and/or removed, methods 200 continue at block 255 where the carrier is removed and the protective material stripped off of the high emissivity layer. The protective may be removed using RIE or another suitable dry or wet chemical process. At block 260, barrier material may be deposited onto a back side of the membrane material. In some embodiments silicon nitride is again thermally grown on exposed silicon surfaces. Alternatively, a PECVD or LPCVD silicon nitride material may be deposited over all exposed surfaces. Notably, other materials may be deposited onto the back side of membrane material 205, in addition to, or instead of, silicon nitride. For example, a high emissivity material can be applied to the back side of the pellicle membrane material to further increase emissivity. Methods 200 continue at block 265 where the monolithic framed pellicle is thermally annealed. Annealing may relieve residual stress in the membrane material and/or the surrounding frame material. The anneal may be performed, for example, in-situ with barrier layer formation (e.g., post SiN growth in the SiN furnace). The anneal may be performed in any appropriate ambient, such as, but not limited to, forming gas ($H_2$:$N_2$). Methods 200 are then substantially complete with the monolithic framed pellicle at output 270 now ready to be affixed to a reticle.

Figure 5:
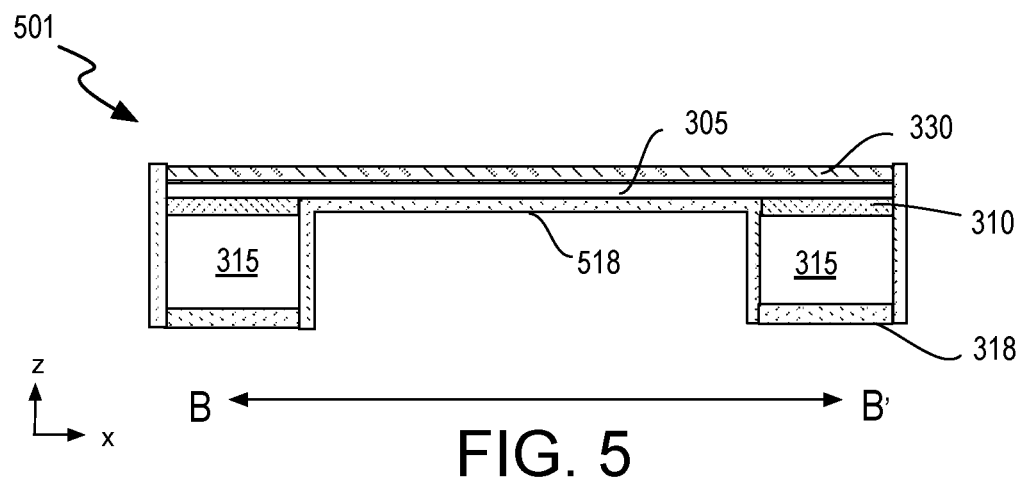
FIG. 5 illustrates a monolithic framed pellicle, in accordance with some embodiments.

FIG. 5 illustrates a monolithic framed pellicle 501, in accordance with some embodiments. As shown, a barrier material layer 518 has been applied to a back side of membrane material 305, rendering it a core of a multi-layered material stack. In this example where dielectric material 310 has been removed from the back side of membrane material 305, dielectric material 310 remains only at the interfaces of frame material 315 and membrane materials 305 around the periphery of monolithic framed pellicle 501. This remnant of dielectric material 310 is indicative of monolithic framed pellicle 501 having been derived from a monolithic SOI staring material.

Figure 6:
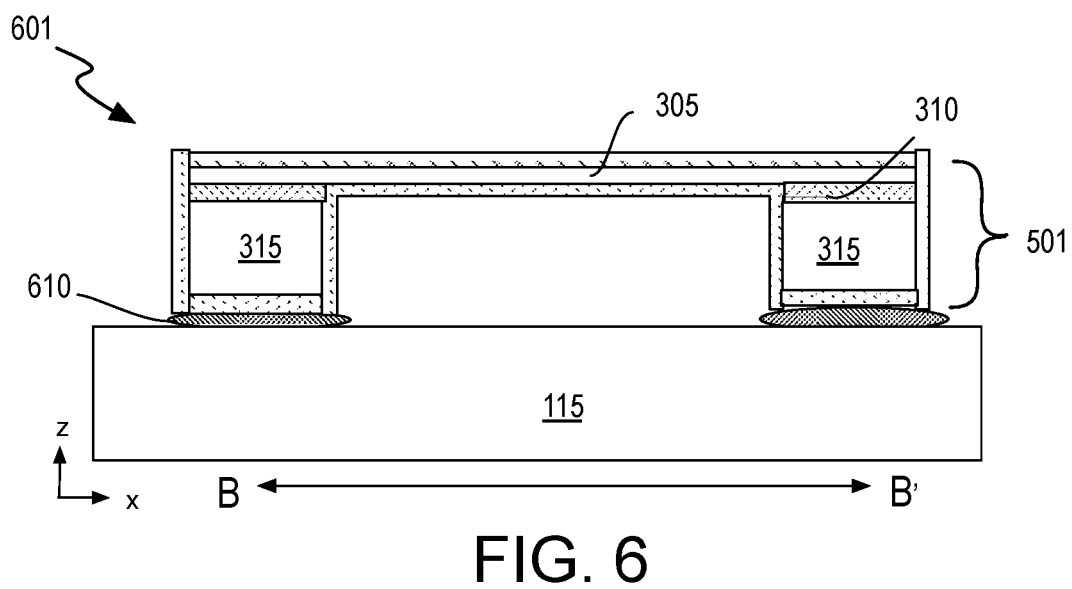
FIG. 6 is a cross-sectional view of a pelliclized reticle assembly, in accordance with some embodiments.

FIG. 6 illustrates a cross-sectional view of a pelliclized reticle assembly 601, in accordance with some embodiments. In this example, a backside of monolithic framed pellicle 501 is affixed to a top surface of reticle 115 by adhesive 610 (e.g. epoxy). In some embodiments where an electrical connection is to be made between monolithic framed pellicle 501 and reticle 115, adhesive 610 may be a conductive material (e.g., solder). Any other technique known for attaching a pellicle to a reticle may be practiced instead. As introduced above, reticle 115 includes a feature pattern (not depicted in FIG. 6) that is to be imaged, for example through purely reflective optics. Pelliclized reticle assembly 601 is ready for use, for example in a EUV lithography system. Although not depicted in FIG. 6, pellicle frame 315 may include one or more structural features (e.g., detents or studs) to mate with one or more structural features (e.g., studs or detents) on reticle 115.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a monolithic framed lithography pellicle comprises a substantially monocrystalline pellicle frame comprising silicon and enclosing a perimeter of an interior area, a substantially monocrystalline pellicle membrane comprising silicon and enclosing one side of the interior area to define an interior cavity, and a dielectric material layer between the pellicle frame and the pellicle membrane.

In second examples, for any of the first examples the pellicle frame comprises predominantly silicon, the pellicle membrane comprises predominantly silicon, and the dielectric material layer comprises predominantly silicon and oxygen.

In third examples, for any of the second examples the pellicle frame and pellicle membrane both consist of silicon and a minority impurity concentration.

In fourth examples, for any of the third examples at least one of the impurities in the pellicle membrane is boron.

In fifth examples, for any of the second examples the pellicle frame is a base layer of a crystal having a first crystal orientation. The pellicle membrane is a top layer of the crystal having the first crystal orientation, and the dielectric material layer is a substantially amorphous material intervening between the base and top layers of the crystal.

In sixth examples, for any of the fifth examples, the dielectric material comprises predominantly silicon and oxygen.

In seventh examples, for any of the fifth examples a front side of the pellicle membrane, opposite the pellicle frame, is a {111} facet of the crystal.

In eighth examples, for any of the first through seventh examples the membrane thickness less than 200 nm, the frame thickness is at least 3 mm, and the interior area is at least 100 mm×100 mm.

In ninth examples, for any of the eighth examples the membrane thickness is at least 50 nm.

In tenth examples, for any of the first through ninth examples the pellicle further comprises one or more polycrystalline or amorphous thin film material layers over a front side of the pellicle membrane, opposite the pellicle frame.

In eleventh examples, for any of the tenth examples the thin film material layers comprise a thin film material having higher emissivity than monocrystalline silicon.

In twelfth examples, for any of the eleventh examples the thin film material layers comprise a Ru layer in contact with the front side of the of the pellicle membrane, the Ru layer having a thickness less than 5 nm.

In thirteenth examples, for any of the first through twelfth examples, the pellicle further comprises one or more polycrystalline or amorphous thin film material layers covering at least a portion of the pellicle frame.

In fourteenth examples, for any of the thirteenth examples the thin film material layers comprise a dielectric material comprising silicon and nitrogen.

In fifteenth examples, for any of the first through fourteenth examples the dielectric material layer is over a back side of the pellicle membrane, facing the cavity, and wherein the dielectric material over the back side has a thickness less than 10 nm.

In sixteenth examples, for any of the first through fifteenth examples the pellicle frame comprises one or more vent grooves in a backside surface opposite the pellicle membrane, or the pellicle membrane comprises one or integrated sensors further comprising an integrated circuit (IC) or microelectromechanical systems (MEMS).

In seventeenth examples, a pelliclized reticle assembly comprises a lithography reticle including a feature pattern to be reflectively imaged upon a workpiece. The assembly comprises a monolithic framed pellicle, comprising a substantially monocrystalline pellicle frame comprising silicon and enclosing a perimeter of an interior area, a substantially monocrystalline pellicle membrane comprising silicon and enclosing one side of the interior area to define an interior cavity, and a dielectric material layer between the pellicle frame and the pellicle membrane. A back side of the pellicle frame is to attach to a mating surface of the reticle to contain the feature pattern within the interior cavity.

In eighteenth examples, for any of the seventeenth examples the assembly further comprises an adhesive between the back side of the pellicle frame and the surface of the reticle.

In nineteenth examples, for any of the seventeenth through eighteenth examples the pellicle frame includes one or more first structural features to mate with one or more second structural features on the reticle.

In twentieth examples a method of fabricating a framed pellicle comprises receiving monolithic workpiece comprising a substantially monocrystalline first material layer over a substantially monocrystalline second material layer with an intervening material layer therebetween. The method comprises attaching the monolithic workpiece to a carrier with a front side of the first material layer facing the carrier. The method comprises subtractively machining a recess into the second material layer with a remainder of the second material layer framing a perimeter of the recess. The method comprises forming a membrane spanning the recess by the exposing a back side of the intervening material layer with an etchant that removes the second material selectively from the intervening material.

In twenty-first examples, for any of the twentieth examples subtractively machining a recess into the second material layer comprises bonnet polishing the back side of the second material layer.

In twenty-second examples, for any of the twentieth through twenty-first examples further comprises at least one of removing the intervening material layer, or depositing one or more polycrystalline or amorphous first material layers over a top surface of the first material layer, or depositing one or more polycrystalline or amorphous second material layers over a bottom surface of the second material layer.

In twenty-third examples, for any of the twentieth through twenty-second examples the method further comprises removing the intervening material layer, depositing a layer comprising Ru over the top surface, and depositing a layer comprising silicon and nitrogen over the bottom surface.

In twenty-fourth examples, a method of fabricating a pelliclized reticle assembly comprises receiving the monolithic framed lithography pellicle of any of the first examples through fifteenth examples, receiving a lithography reticle comprising a feature pattern to be imaged by a lithography system, and mechanically coupling a back side of the frame with a surface of the reticle to contain the feature pattern within the interior cavity of the monolithic framed lithography pellicle.

In twenty-fifth examples, for any of the twenty-fourth examples mechanically coupling a back side of the frame with a surface of the reticle comprises curing an adhesive at an interface of the back side of the frame and the surface of the reticle.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A monolithic lithography pellicle, comprising:
   a frame comprising substantially monocrystalline silicon;
   a membrane comprising substantially monocrystalline silicon; and
   an amorphous material between the frame and the membrane.

2. The pellicle of claim 1, wherein the amorphous material comprises predominantly silicon and oxygen.

3. The pellicle of claim 2, wherein the membrane comprises a minority impurity concentration.

4. The pellicle of claim 3, wherein at least one of the impurities in the membrane is boron.

5. The pellicle of claim 1, wherein the frame has a first crystal orientation; and
   the membrane has the first crystal orientation.

6. The pellicle of claim 5, wherein a front side of the membrane, opposite the frame, is a {111} crystal plane.

7. The pellicle of claim 1, wherein:
   the membrane has a thickness less than 200 nm;
   the frame has a thickness of at least 3 mm; and
   the frame encloses an interior area spanned by the membrane, and the interior area is at least 100 mm×100 mm.

8. The pellicle of claim 1, further comprising one or more thin film materials over a front side of the pellicle membrane, opposite the frame, wherein the thin film materials have higher emissivity than monocrystalline silicon.

9. The pellicle of claim 1, further comprising a layer of predominantly Ru in contact with the front side of the of the membrane, opposite the frame.

10. The pellicle of claim 9, wherein the Ru layer has a thickness less than 5 nm.

11. The pellicle of claim 1, further comprising a dielectric material layer comprising silicon and nitrogen on at least a portion of the frame.

12. The pellicle of claim 11, wherein the dielectric material layer is on a back side of the pellicle membrane, proximal to the frame.

13. A pelliclized reticle assembly, comprising:
   a lithography reticle including a feature pattern to be reflectively imaged upon a workpiece; and
   a monolithic lithography pellicle, comprising:
      a frame comprising substantially monocrystalline silicon;
      a membrane comprising substantially monocrystalline silicon; and
      an amorphous material between the frame and the membrane.

14. The pelliclized reticle assembly of claim 13, further comprising an adhesive between a back side of the frame and the reticle.

15. The pelliclized reticle assembly of claim 13, wherein the frame comprises a first structural feature that interfaces with a complementary second structural feature on the reticle.

16. A method comprising:
   receiving a monolithic lithography pellicle comprising:
      a frame comprising substantially monocrystalline silicon;
      a membrane comprising substantially monocrystalline silicon; and
      an amorphous material between the frame and the membrane;
   receiving a lithography reticle comprising a feature pattern to be imaged by a lithography system; and
   mechanically coupling the frame with the reticle to contain the feature pattern within an interior cavity of the pellicle.

17. The method of claim 16, wherein mechanically coupling the frame with the reticle comprises curing an adhesive between a back side of the frame and a surface of the reticle.

18. The method of claim 16, further comprising depositing, upon the pellicle, a material layer comprising predominantly Ru over a front side of the pellicle membrane, opposite the frame, wherein the thin film materials have higher emissivity than monocrystalline silicon.

19. The method of claim 16, further comprising depositing, upon at least a portion of the frame, a dielectric material layer comprising silicon and nitrogen.

20. The method of claim 16, further comprising reflectively imaging the feature pattern upon a workpiece.

* * * * *